United States Patent
Lee et al.

(10) Patent No.: US 11,965,936 B2
(45) Date of Patent: Apr. 23, 2024

(54) BATTERY DIAGNOSIS APPARATUS AND METHOD

(71) Applicant: LG ENERGY SOLUTION, LTD., Seoul (KR)

(72) Inventors: Hyun Chul Lee, Daejeon (KR); Dong Keun Kwon, Daejeon (KR); Sung Yul Yoon, Daejeon (KR); Seung Hyun Kim, Daejeon (KR); An Soo Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 257 days.

(21) Appl. No.: 17/607,255

(22) PCT Filed: Jul. 23, 2020

(86) PCT No.: PCT/KR2020/009704
§ 371 (c)(1),
(2) Date: Oct. 28, 2021

(87) PCT Pub. No.: WO2021/049753
PCT Pub. Date: Mar. 18, 2021

(65) Prior Publication Data
US 2022/0229122 A1  Jul. 21, 2022

(30) Foreign Application Priority Data
Sep. 11, 2019  (KR) .......................... 10-2019-0113169

(51) Int. Cl.
*G01R 31/396*  (2019.01)
*G01R 31/3835*  (2019.01)

(52) U.S. Cl.
CPC ....... *G01R 31/396* (2019.01); *G01R 31/3835* (2019.01)

(58) Field of Classification Search
None
See application file for complete search history.

(56) References Cited

U.S. PATENT DOCUMENTS 6,432,569 B1     8/2002  Zeilinger et al.
2002/0171400 A1*  11/2002  Koyama ............... G04G 21/04
                                                  320/135
(Continued)

FOREIGN PATENT DOCUMENTS

| CN | 102203626 A | 9/2011 |
| CN | 102341715 A | 2/2012 |

(Continued)

OTHER PUBLICATIONS

International Search Report for PCT/KR2020/009704 dated Oct. 27, 2020.

(Continued)

*Primary Examiner* — Jas A Sanghera
(74) *Attorney, Agent, or Firm* — Birch, Stewart, Kolasch & Birch, LLP (57) ABSTRACT

A battery diagnosis apparatus for diagnosing a battery including battery cells, the apparatus according to an embodiment may include a voltage measurer for measuring the voltage of each battery cell during a preset period of time, a voltage variation calculator for calculating an individual voltage variation of each battery cell during the preset period of time, an average voltage variation calculator for calculating an average voltage variation of the battery cells during the preset period of time, and an abnormality detector for determining that a voltage abnormality has occurred in at least one battery cell among the battery cells when a difference between the voltage variation of the at least one battery cell and the average voltage variation of the at least one battery cell is greater than a threshold value.

9 Claims, 4 Drawing Sheets

(56) References Cited

U.S. PATENT DOCUMENTS

| | | |
|---|---|---|
| 2004/0001996 A1 | 1/2004 | Sugimoto |
| 2010/0066379 A1 | 3/2010 | Iida |
| 2010/0085009 A1 | 4/2010 | Kang et al. |
| 2010/0194339 A1 | 8/2010 | Yang et al. |
| 2011/0037476 A1 | 2/2011 | Jung et al. |
| 2011/0077881 A1 | 3/2011 | Matsumura et al. |
| 2013/0342212 A1 | 12/2013 | Kawahira et al. |
| 2016/0025814 A1 | 1/2016 | Ide et al. |
| 2017/0350946 A1 | 12/2017 | Mukaitani et al. |
| 2018/0045785 A1* | 2/2018 | Kodama ............ H01M 10/6555 |
| 2019/0077265 A1* | 3/2019 | Ono .................... H01M 10/482 |
| 2019/0195952 A1 | 6/2019 | Riley et al. |
| 2020/0287251 A1 | 9/2020 | Yonekura et al. |
| 2020/0412159 A1* | 12/2020 | Snyder ................ H02J 7/00714 |

FOREIGN PATENT DOCUMENTS

| | | |
|---|---|---|
| CN | 105527583 A | 4/2016 |
| CN | 108107364 A | 6/2018 |
| CN | 108646183 A | 10/2018 |
| JP | 5-266927 A | 10/1993 |
| JP | 8-126220 A | 5/1996 |
| JP | 11-273702 A | 10/1999 |
| JP | 2004-31120 A | 1/2004 |
| JP | 2005-322456 A | 11/2005 |
| JP | 2007-10588 A | 1/2007 |
| JP | 2007-46942 A | 2/2007 |
| JP | 4019815 B2 | 12/2007 |
| JP | 2008-118777 A | 5/2008 |
| JP | 2009-37962 A | 2/2009 |
| JP | 2009-257928 A | 11/2009 |
| JP | 2011-76746 A | 4/2011 |
| JP | 5343299 B2 | 11/2013 |
| JP | 2016-90416 A | 5/2016 |
| JP | 2017-127090 A | 7/2017 |
| JP | 2017-156268 A | 9/2017 |
| KR | 10-2010-0089768 A | 8/2010 |
| KR | 10-2014-0001097 A | 1/2014 |
| KR | 10-1671998 B1 | 11/2016 |
| KR | 10-2018-0071798 A | 6/2018 |
| KR | 10-1865402 B1 | 7/2018 |
| WO | WO 01/96146 A1 | 12/2001 |
| WO | WO 2016/013241 A1 | 1/2016 |
| WO | WO 2019/069390 A1 | 4/2019 |
| WO | WO 2019/121176 A1 | 6/2019 |

OTHER PUBLICATIONS

Extended European search report for the corresponding European patent application No. 20862918.8 dated Apr. 29, 2022.

* cited by examiner

[FIG. 1]

Conventional Art

BATTERY DIAGNOSIS APPARATUS AND METHOD

CROSS-REFERENCE TO RELATED APPLICATIONS

This application claims the benefit of Korean Patent Application No. 10-2019-0113169, filed on Sep. 11, 2019, in the Korean Intellectual Property Office, the disclosure of which is incorporated herein in its entirety by reference.

TECHNICAL FIELD

The present invention relates to a battery diagnosis apparatus and method, and more particularly, to a battery diagnosis apparatus and method for detecting a sudden drop in voltage during the charge and discharge of a battery.

BACKGROUND ART

Recently, research and development for secondary batteries have been actively conducted. Here, a, secondary battery is a battery which may be charged/discharged, and includes all of typical Ni/Cd batteries, Ni/MH batteries, and the like and recent lithium ion batteries. A lithium ion battery among secondary batteries has an advantage in that the energy density thereof is much higher than that of typical Ni/Cd batteries, Ni/MH batteries, and the like. Also, a lithium ion battery may be manufactured small and lightweight, and thus, is used as a power source of mobile devices. In addition, a lithium ion battery has attracted attention as a next generation energy storage medium since the range of use thereof has been expanded to being a power source of electric vehicles.

In addition, a secondary battery is generally used as a battery pack including a battery module in which a plurality of battery cells are connected in series and/or in parallel. In addition, the state and operation of a battery pack is managed and controlled by a battery management system.

If an abnormality occurs, such as an insulation error of the battery pack or an internal short of the battery cell itself, the cell voltage of the battery module may suddenly drop. At this time, typically, a method of diagnosing by detecting whether or not there is a voltage drop using a voltage difference (slope) from a previous time in a state in which no current flows (Rest) has been used, and thus, it is absolutely necessary to have a separate current sensor for determining the state in which no current flows.

DISCLOSURE OF THE INVENTION

Technical Problem

An aspect of the present invention provides a battery diagnosis apparatus capable of diagnosing a voltage abnormality of a battery cell by using a voltage variation of the battery cell without a separate current sensor, thereby detecting an abnormality due to a sudden voltage drop of a battery not only in a state in which the voltage of the battery does not flow (Rest) but also during the charge and discharge of the battery.

Technical Solution

According to an aspect of the present invention, there is provided a battery diagnosis apparatus for diagnosing a battery including battery cells, the apparatus including a voltage measurer configured to measure the voltage of each battery cell during a preset period of time, a voltage variation calculator configured to calculate an individual voltage variation of each battery cell during the preset period of time, an average voltage variation calculator configured to calculate an average voltage variation of the battery cells during the preset period of time, and an abnormality detector configured to determine that a voltage abnormality has occurred in at least one battery cell among the battery cells when a difference between the voltage variation of the at least one battery cell and the average voltage variation of the at least one battery cell is greater than a threshold value.

The voltage variation calculator of the battery diagnosis apparatus according to an embodiment of the present invention may calculate a voltage variation of each battery cell during the charge or discharge of the battery cells.

The voltage variation calculator of the battery diagnosis apparatus according to an embodiment of the present invention may calculate the voltage variation of each battery cell in a state in which no current flows in each battery cell.

The threshold value of the battery diagnosis apparatus according to an embodiment of the present invention may be set according to the manufacturer-specific specifications of each battery cell.

The threshold value of the battery diagnosis apparatus according to an embodiment of the present invention may be set according to the manufacturer-specific specifications of the voltage measurer.

The voltage variation calculator of the battery diagnosis apparatus according to an embodiment of the present invention may calculate the voltage variation of each battery cell in a section in which the state of charge (SOC) of each battery cell is equal to or greater than a preset reference value.

The preset reference value of the battery diagnosis apparatus according to an embodiment of the present invention may be set according to the type of each battery cell.

According to another aspect of the present invention, there is provided a battery diagnosis method for diagnosing a battery, the battery including battery cells, the method including measuring the voltage of each battery cell during a preset period of time, calculating an individual voltage variation of each battery cell during the preset period of time, calculating an average voltage variation of the battery cells during the preset period of time, and determining that a voltage abnormality has occurred in at least one battery cell among the battery cells when a difference between the voltage variation of the at least one battery cell and the average voltage variation of the at least one battery cell is greater than a threshold value.

Effects of the Invention

According to a battery diagnosis apparatus of the present invention, a voltage abnormality of a battery cell is diagnosed by using a voltage variation of the battery cell without a separate current sensor. Therefore, it is possible to detect an abnormality due to a sudden voltage drop of a battery not only during the charge and discharge of the battery but also in a rest state in which the voltage of the battery does not flow.

MODE FOR CARRYING OUT THE INVENTION

Hereinafter, various embodiments of the present invention will be described in detail with reference to the accompanying drawings. In the present document, like reference numerals are used for like elements throughout the drawings, and redundant descriptors of the like elements are omitted.

For the various embodiments of the present invention disclosed in the present document, specific structural to functional descriptions are merely illustrative of the present invention. The various embodiments of the present invention may be embodied in various forms and should not be construed as limited to the embodiments set forth herein.

Terms such as "a first," "a second," "first," and "second" used in various embodiments may modify various components regardless of the order and/or importance thereof, and do not limited the corresponding components. For example, a first component may be referred to as a second component without departing from the scope of the present invention, and similarly, a second component may also be referred to as a first component.

The terms used in this document are only used to describe specific embodiments, and may not be intended to limit the scope of other embodiments. Singular expressions may include plural expressions unless the context clearly indicates otherwise.

All the terms used herein, including technical or scientific terms, may have the same meanings as those commonly understood by those skilled in the art of the present invention. Terms that are defined in a dictionary commonly used should be interpreted as having the same or similar meaning to the meaning in the context of the related art, and should not be interpreted as having an ideal or overly formal meaning unless explicitly defined in the present document. In some cases, even the terms defined in this document should not be interpreted as excluding embodiments of the present invention.

Figure 1:
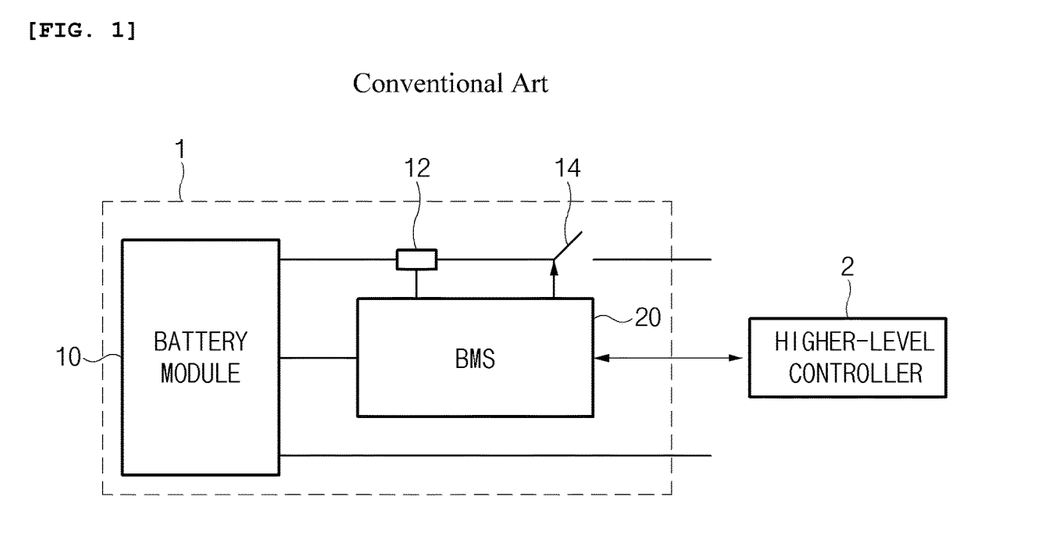
FIG. 1 is a block diagram showing a typical configuration of a battery control system.

FIG. 1 is a block diagram showing a typical configuration of a battery control system.

Specifically, FIG. 1 is a configuration diagram schematically showing a battery control system including a battery pack 1 according to an embodiment of the present invention and a higher-level controller 2 included in a higher-level system.

As illustrated in FIG. 1, the battery pack 1 is composed of one or more battery cells and includes a battery module 10 chargeable and dischargeable, a switching unit 14 connected in series to a +terminal side or a −terminal side of the battery module 10 to control the charge/discharge current flow of the battery module 10, and a battery management system (BMS) 20 for controlling and managing by monitoring the voltage, current, temperature, and the like of the battery pack 1 to prevent overcharging, overdischarging, and the like.

Here, the switching unit 14 is a semiconductor switching element for controlling a current flow for the charge or discharge of the battery module 10, and for example, at least one MOSFET may be used.

In addition, the BMS 20 may measure or calculate the voltage and the current of a gate, a source, a drain, and the like of the semiconductor switching element in order to monitor the voltage, current, temperature, and the like of the battery pack 1. In addition, using a sensor 12 provided adjacent to the semiconductor switching element 14, the voltage, current, temperature, and the like of the battery pack 1 may be measured. The BMS 20 is an interface which receives measurement values of various parameters described above are input, and may include a plurality of terminals, a circuit connected to the terminals to process input values, and the like.

In addition, the BMS 20 may control the ON/OFF of the switching element 14, for example MOSFET, and may be connected to the battery module 10 to monitor the state of the battery module 10.

The higher-level controller 2 may transmit a control signal for the battery module 10 to the BMS 20. Accordingly, the operation of the BMS 20 may be controlled on the basis of a signal applied from the higher-level controller 2. A battery cell of the present invention may be a component included in a battery pack used in an energy storage system (ESS), a vehicle, or the like. However, the battery cell is not limited to such uses.

The configuration of the battery pack 1 and the configuration of the BMS 20 described above are known in the art, and thus, detailed descriptions thereof will be omitted.

Figure 2:
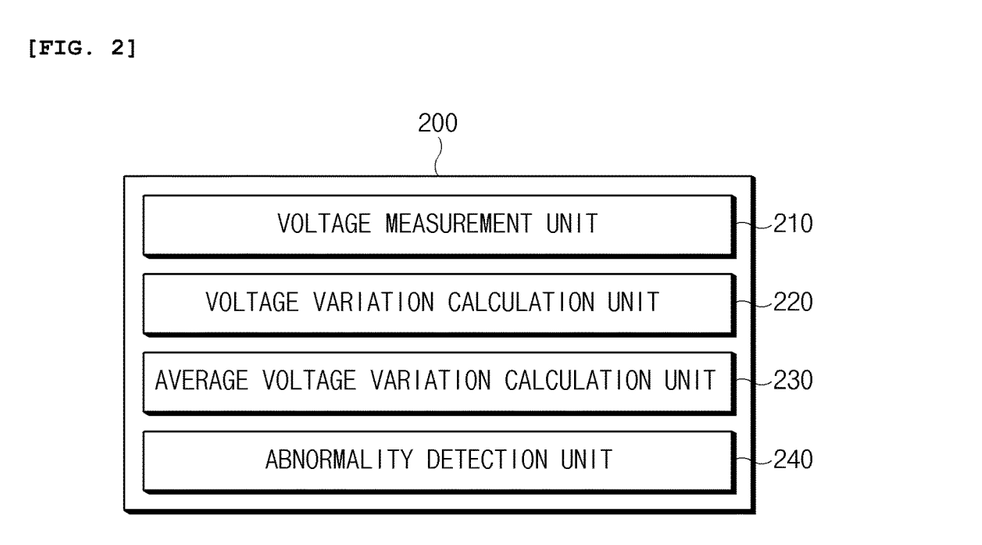
FIG. 2 is a block diagram showing a configuration of a battery diagnosis apparatus according to an embodiment of the present invention.

FIG. 2 is a block diagram showing a configuration of a battery diagnosis apparatus according to an embodiment of the present invention.

Referring to FIG. 2, a battery diagnosis apparatus 200 according to an embodiment of the present invention may include a voltage measurement unit 210, a voltage variation calculation unit 220, an average voltage variation calculation unit 230, and an abnormality detection unit 240.

The voltage measurement unit 210 may measure the voltage of each battery cell during a preset period of time. For example, the voltage measurement unit 210 may be a measurement circuit included in the above-described battery management system BMS.

The voltage variation calculation unit 220 may calculate an individual voltage variation of each battery cell measured by the voltage measurement unit 210 during the preset period of time. For example, when the voltage of a battery cell is measured at 2 second intervals in the voltage measurement unit 210, the voltage variation calculation unit 220 may calculate an individual voltage variation of each battery cell for two seconds. However, this is only exemplary. The time interval may be arbitrarily set by a user.

Particularly, the voltage variation calculation unit 220 may calculate a voltage variation of each battery cell not only in a state in which no current flows in the battery cell (rest) but also during the charge or discharge of the battery cell. Therefore, typically, it is absolutely necessary to have a current sensor to confirm the rest state of a battery. However, the battery diagnosis apparatus 200 according to an embodiment of the present invention may detect a sudden voltage drop only by using a battery voltage variation without having to determine the rest state of the battery through a current sensor.

In addition, the voltage variation calculation unit 220 may calculate the voltage variation of each battery cell for a section in which the state of charge (SOC) of the battery cell is equal to or greater than a preset reference value. This is because the resistance of a battery itself increases in a section in which the SOC of the battery is low, so that the deviation of the Direct Current Internal Resistance (DCIR) may be increased. At this time, the reference value of the SOC may be set according to the type of a battery cell.

The average voltage variation calculation unit 230 may calculate an average voltage variation of a plurality of battery cells during a preset period of time. For example, the average voltage variation calculation unit 230 may calculate the average voltage variation of all battery cells included in a specific battery pack during a preset period of time.

The abnormality detection unit 240 may determine that a voltage abnormality has occurred in a corresponding battery cell when there is a battery cell having a difference between the individual voltage variation calculated in the voltage variation calculation unit 220 and the average voltage variation calculated in the average voltage variation calculation unit 230 being greater than a threshold value.

That is, the abnormality detection unit 240 may detect a voltage abnormality of a battery according to the following equation.

$$\Delta V_{cell,each} - \Delta V_{cell,average} = V_{threshold} \quad \text{[Equation 1]}$$

At this time, a current SOC value>$SOC_{threshold}$

In this case, the threshold value of the abnormality detection unit 240 may be set according to the manufacturer-specific specifications of the battery cell and the voltage measurement unit 210. For example, the threshold value may be set in consideration of a voltage measurement error of the voltage measurement unit 210, a capacity error between battery cells generated during the assembly of a battery module, and the like.

Meanwhile, although in FIG. 2, the battery diagnosis apparatus 200 according to an embodiment of the present invention may further include a memory unit for storing an individual voltage variation of each battery cell and an average voltage variation of the plurality of battery cells.

As described above, a battery diagnosis apparatus according to an embodiment of the present invention is capable of diagnosing a voltage abnormality of a battery cell by using a voltage variation of the battery cell without a separate current sensor, thereby detecting an abnormality due to a sudden voltage drop of a battery not only in a rest state in which the voltage of the battery does not flow but also during the charge and discharge of the battery.

Figure 3:
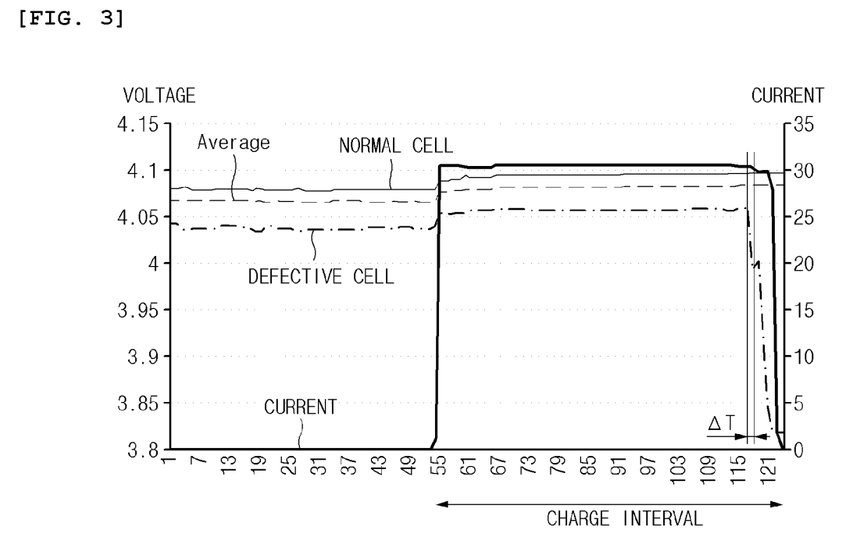
FIG. 3 is a diagram showing that a diagnosis experiment has performed on a defective cell through a battery diagnosis apparatus according to an embodiment of the present invention when a battery is being charged.

FIG. 3 is a diagram showing that a diagnosis experiment has performed on a defective cell through a battery diagnosis apparatus according to an embodiment of the present invention when a battery is being charged.

Referring to FIG. 3, the horizontal axis represents time (seconds), the vertical axis (left) represents a voltage, and the vertical axis (right) represents a current. In addition, the graph of FIG. 3 represents the voltage of a normal battery cell, the voltage of a defective battery cell, the average voltage of a plurality of cells, and the charge current of a battery, each measured in a charge state.

As shown in FIG. 3, the average voltage variation of a battery cell, the voltage variation of a normal battery cell, and the voltage variation of a defective battery cell for one second may be represented as follows. In addition, a threshold value when diagnosing an abnormal voltage drop of a battery was set to 15 mV. Meanwhile, in FIG. 3, the time interval is set to one second and the threshold value is set to 15 mV. However, a user may arbitrarily set the time interval and the threshold value.

Average voltage variation of battery cell:
$\Delta V_{cell,\ average}$=0 V (4.083 V No change)
Voltage variation of normal battery cell:
$\Delta V_{cell,\ normal}$=4.097 V−4.098 V=−0.001 V
|−0.001 V−0 V|<Threshold value (15 mV)
Voltage variation of defective battery cell:
$\Delta V_{cell,\ abnormal}$=4.123 V−4.095 V=0.028 V
|0.028 V−0 V|>Threshold value (15 mV)

As described above, in the case of the normal battery cell, the difference between the individual voltage variation and the average voltage variation is less than the threshold value, so that it is not determined as an abnormal voltage drop. However, in the case of the defective battery cell, the difference between the individual voltage variation and the average voltage variation is greater than the threshold value, so that it may be determined as an abnormal voltage drop.

Figure 4:
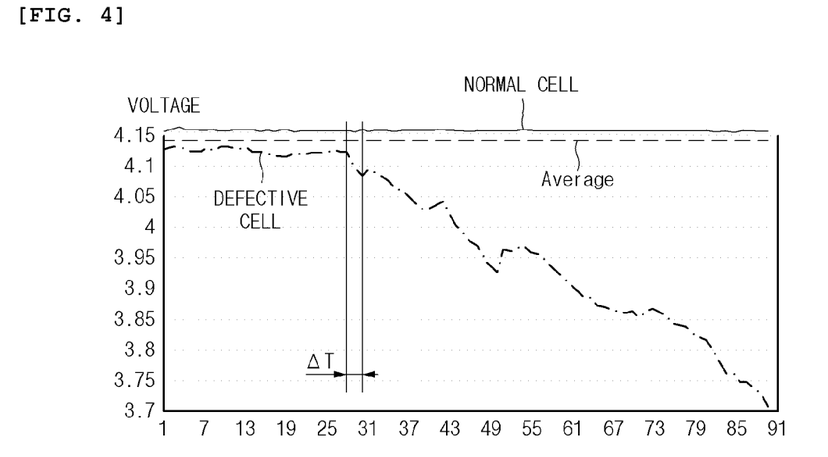
FIG. 4 is a diagram showing that a diagnosis experiment has performed on a defective cell through a battery diagnosis apparatus according to an embodiment of the present invention when a battery is in a rest state.

FIG. 4 is a diagram showing that a diagnosis experiment has performed on a defective cell through a battery diagnosis apparatus according to an embodiment of the present invention when a battery is in a rest state.

Referring to FIG. 4, the horizontal axis represents time (seconds), the vertical axis (left) represents a voltage, and the vertical axis (right) represents a current. In addition, the graph of FIG. 4 represents the voltage of a normal battery cell, the voltage of a defective battery cell, the average voltage of a plurality of cells, and the charge current of a battery, each measured in a rest state.

In FIG. 4 also, as in the case of FIG. 3, the average voltage variation of a battery cell, the voltage variation of a normal battery cell, and the voltage variation of a defective battery cell for one second may be represented as follows. In addition, a threshold value when diagnosing an abnormal voltage drop of a battery was set to 15 mV.

Average voltage variation of battery cell:
$\Delta V_{cell,\ average}$=0 V (4.142 V No change)
Voltage variation of normal battery cell:
$\Delta V_{cell,\ normal}$=0 V
|0 V−0 V|<Threshold value (15 mV)
Voltage variation of defective battery cell:
$\Delta V_{cell,\ abnormal}$=4.123 V−4.095 V=0.028 V
|0.028 V−0 V|>Threshold value (15 mV)

As described above, in the case of the normal battery cell, the difference between the individual voltage variation and the average voltage variation is less than the threshold value, so that it is not determined as an abnormal voltage drop. However, in the case of the defective battery cell, the difference between the individual voltage variation and the average voltage variation is greater than the threshold value, so that it may be determined as an abnormal voltage drop.

As described above, the battery diagnosis apparatus according to an embodiment of the present invention is capable of detecting an abnormal voltage drop of a battery cell during the charge/discharge of a battery without having to confirm whether the battery is in a rest state through a current sensor.

Figure 5:
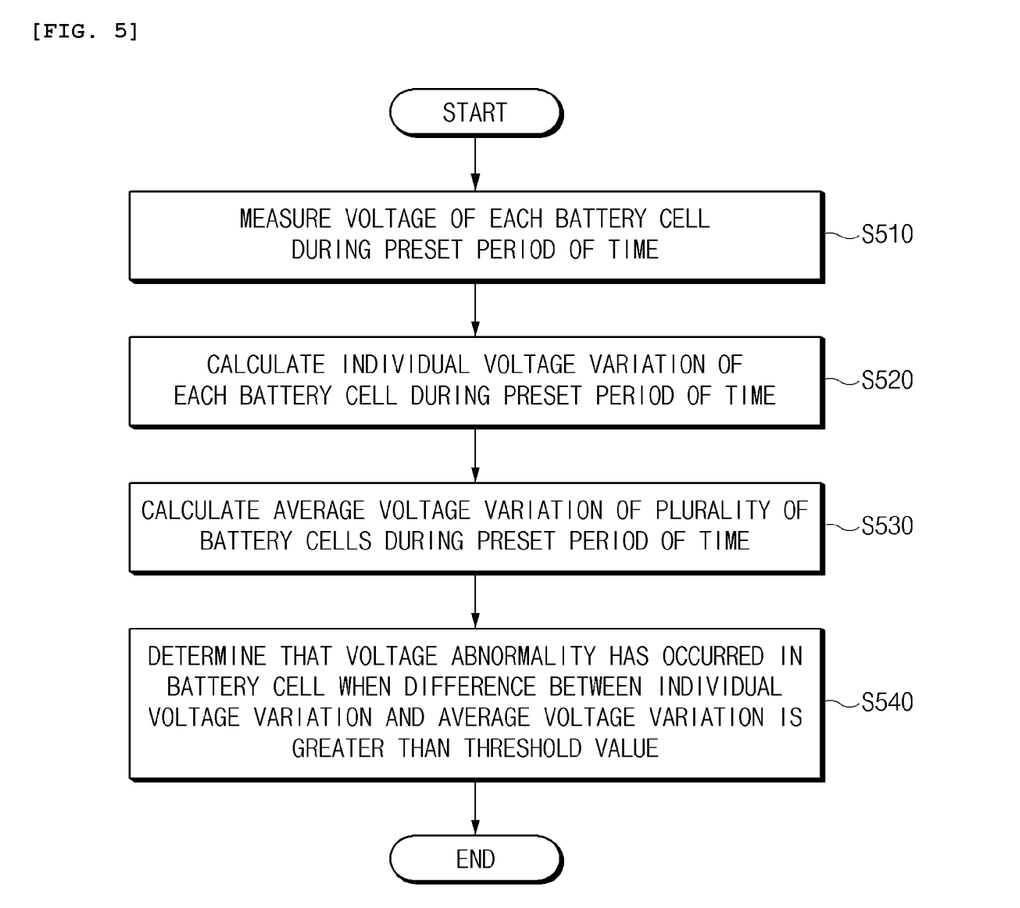
FIG. 5 is a flowchart showing a battery diagnosis method according to an embodiment of the present invention.

FIG. 5 is a flowchart showing a battery diagnosis method according to an embodiment of the present invention.

Referring to FIG. 5, first, the voltage of each battery cell is measured during a preset period of time S510. At this time, a period of time during which the voltage of a battery cell is measured may be arbitrarily set by a user.

Thereafter, an individual voltage variation of each battery cell during a preset period of time is calculated S520. In Step S520, it is possible to calculate the voltage variation of each battery cell not only in a rest state in which no current flows in the battery cell but also during the charge or discharge of the battery cell.

Next, an average voltage variation of a plurality of battery cells during the preset period of time is calculated S530. At this time, the average voltage variation of all battery cells included in a specific battery pack may be calculated.

In addition, in Step S520 and in Step S530, in order to reduce the effect due to the resistance of a battery itself, the voltage variation of each battery cell is calculated for a section in which the SOC of the battery cell is equal to or greater than a reference value.

Thereafter, when there is a battery cell having a difference between the individual voltage variation calculated in Step S520 and the average voltage variation calculated in Step S530 being greater than a threshold value, it is determined that a voltage abnormality has occurred in a corresponding battery cell S540.

In this case, the threshold value of Step S540 may be set according to the manufacturer-specific specifications of the battery cell and a voltage measurement unit (for example, the battery management system BMS). For example, the threshold value may be set in consideration of a voltage measurement error of the voltage measurement unit, a capacity error between battery cells generated during the assembly of a battery module, and the like.

As described above, according to the method for diagnosing a battery according to an embodiment of the present invention, a voltage abnormality of a battery cell is diagnosed by using a voltage variation of the battery cell without a separate current sensor. Therefore, it is possible to detect an abnormality due to a sudden voltage drop of a battery not only during the charge and discharge of the battery but also in a rest state in which the voltage of the battery does not flow.

Figure 6:
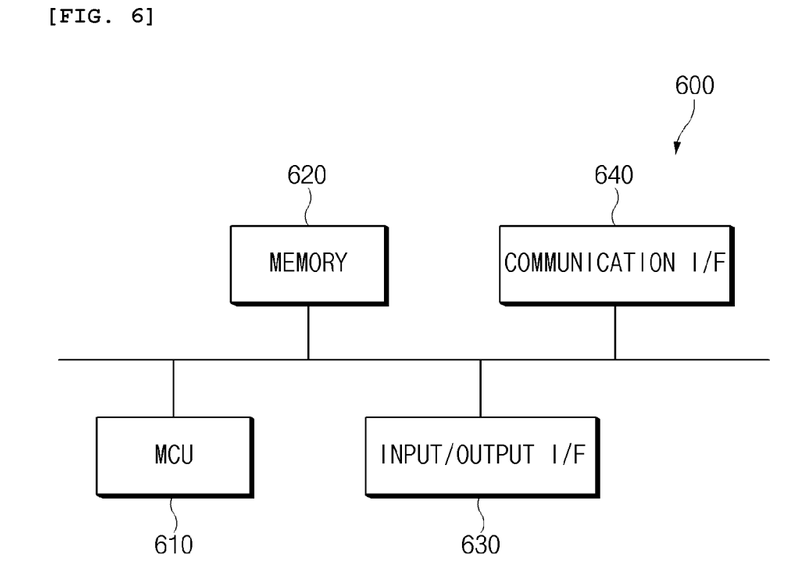
FIG. 6 is a diagram showing a configuration of hardware according to an embodiment of the present invention.

FIG. 6 is a diagram showing a configuration of hardware according to an embodiment of the present invention.

As shown in FIG. 6, a battery management apparatus 600 may have a micro-controller (MCU) 610 for controlling various processing and each component, a memory 620 in which an operating system program, various programs (for example, a battery pack abnormality diagnosis program or a battery pack temperature estimation program), and the like are stored, an input/output interface 630 for providing an input interface and an output interface between a battery cell module and/or a switching unit (for example, a semiconductor switching element), and a communication interface 640 capable of communicating with the outside (for example, a higher-level controller) through a wired/wireless communication network. As described above, a computer program according to the present invention is stored in the memory 620 and processed by the micro-controller 610, and thus, may be implemented as, for example, a module which performs each functional block illustrated in FIG. 2.

In the above, even if all the components constituting the embodiments of the present invention have been described as being combined or combined to operate as one, the present invention is not necessarily limited to these embodiments. That is, if within the scope of the present invention, all of the components may be selectively combined and operated as one or more.

In addition, the terms "include," "consist," or "have" as described above mean that a corresponding component may be intrinsic, unless specifically stated otherwise, and it should interpreted as including other components rather than excluding other components. All terms including technical or scientific terms have the same meanings as those commonly understood by those skilled in the art to which the present invention pertains, unless defined otherwise. Terms commonly used as those defined in a commonly used dictionary should be construed as being consistent with the context of the relevant art, and are not to be construed in an idealized or overly formal sense unless expressly defined in the present invention.

The above description is merely illustrative of the technical idea of the present invention, and those skilled in the art to which the present invention pertains may make various modifications and variations without departing from the essential characteristics of the present invention. Therefore, the embodiments disclosed in the present invention are not intended to limit the technical spirit of the present invention, but to explain, and the scope of the technical spirit of the present invention is not limited by these embodiments. The scope of protection of the present invention should be construed by the following claims, and all technical concepts within the scope of the present invention should be construed as being included within the scope of the rights of present invention.

The invention claimed is:

1. A battery diagnosis apparatus for diagnosing a battery including battery cells, the apparatus comprising:
   a voltage measurer configured to measure the voltage of each battery cell during a preset period of time while charging and/or discharging of the battery;
   a voltage variation calculator for calculating an individual voltage variation of each battery cell during the preset period of time;
   an average voltage variation calculator for calculating an average voltage variation of the battery cells during the preset period of time; and
   an abnormality detector for determining that a voltage abnormality has occurred in at least one battery cell among the battery cells when the difference between the voltage variation of the at least one battery cell and the average voltage variation is greater than a threshold value.

2. The battery diagnosis apparatus of claim 1, further comprising a memory for storing the individual voltage variation of each battery cell and the average voltage variation of the battery cells.

3. The battery diagnosis apparatus of claim 1, wherein the voltage variation calculator is configured to calculate a voltage variation of each battery cell during the charge or discharge of each battery cell.

4. The battery diagnosis apparatus of claim 1, wherein the threshold value is set according to the manufacturer-specific specifications of each battery cell.

5. The battery diagnosis apparatus of claim 1, wherein the threshold value is set according to the manufacturer-specific specifications of the voltage measurer.

6. The battery diagnosis apparatus of claim 1, wherein the threshold value is 15 mV.

7. The battery diagnosis apparatus of claim 1, wherein the voltage variation calculator is configured to calculate the voltage variation of each battery cell in a section in which the state of charge (SOC) of each battery cell is equal to or greater than a preset reference value.

8. The battery diagnosis apparatus of claim 7, wherein the preset reference value is set according to the type of each battery cell.

9. A battery diagnosis method for diagnosing a battery, the battery including battery cells, the method comprising:

measuring the voltage of each battery cell during a preset period of time while charging and/or discharging of the battery;

calculating an individual voltage variation of each battery cell during the preset period of time;

calculating an average voltage variation of the battery cells during the preset period of time; and determining that a voltage abnormality has occurred in at least one battery cell among the battery cells when the difference between the voltage variation of the at least one battery cell and the average voltage variation is greater than a threshold value.

* * * * *